United States Patent
Li et al.

(10) Patent No.: US 9,368,520 B2
(45) Date of Patent: Jun. 14, 2016

(54) ARRAY SUBSTRATE, MANUFACTURING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xin Li, Beijing (CN); Ying Zhang, Beijing (CN); Yang Pei, Beijing (CN); Jinbo Ding, Beijing (CN); Jing Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/568,699

(22) Filed: Dec. 12, 2014

(65) Prior Publication Data

US 2016/0056177 A1     Feb. 25, 2016

(30) Foreign Application Priority Data

Aug. 22, 2014   (CN) .......................... 2014 1 0418430

(51) Int. Cl.
    *H01L 27/14*       (2006.01)
    *H01L 27/12*       (2006.01)
    *G02F 1/1362*      (2006.01)

(52) U.S. Cl.
    CPC ........ *H01L 27/124* (2013.01); *G02F 1/136286* (2013.01); *H01L 27/127* (2013.01); *G02F 2001/136218* (2013.01)

(58) Field of Classification Search
    CPC ........................... H01L 27/1214; H01L 27/12
    USPC .............................................. 257/72; 438/151
    See application file for complete search history.

(56) References Cited

U.S. PATENT DOCUMENTS

| | | | | |
|---|---|---|---|---|
| 9,116,398 | B2* | 8/2015 | Jia ...................... | G02F 1/133514 |
| 2010/0123845 | A1* | 5/2010 | Kim ..................... | H01L 27/124 349/46 |
| 2014/0078433 | A1* | 3/2014 | Li ...................... | G02F 1/134336 349/42 |
| 2014/0168558 | A1* | 6/2014 | Shi ........................ | G02F 1/1362 349/43 |
| 2015/0077671 | A1* | 3/2015 | Jia ..................... | G02F 1/133514 349/42 |

* cited by examiner

*Primary Examiner* — Jami M Valentine
(74) *Attorney, Agent, or Firm* — Nath, Goldberg & Meyer; Joshua B. Goldberg

(57) ABSTRACT

The present invention provides array substrate, manufacturing method thereof, and display device, relating to manufacturing technology field of liquid crystal display. The array substrate of the present invention includes: a base substrate, on which a plurality of gate lines and a plurality of data lines are provided; shielding electrodes, which are provided above and electrically insulated from the data lines, and the shielding electrodes at least partially cover the data lines; first electrodes, which are provided in the same layer as the shielding electrodes and are electrically insulated from the shielding electrodes; second electrodes, which are provided above and electrically insulated from the first electrodes, wherein, the shielding electrodes are applied with a shielding voltage signal, the second electrodes are applied with a stable voltage signal, and no electric field or weak electric filed is formed between the shielding electrodes and the second electrodes.

17 Claims, 3 Drawing Sheets

ARRAY SUBSTRATE, MANUFACTURING METHOD THEREOF AND DISPLAY DEVICE

FIELD OF THE INVENTION

The present invention relates to the manufacturing technology field of liquid crystal display, and particularly relates to an array substrate, a manufacturing method thereof and a display device.

BACKGROUND OF THE INVENTION

With the development of display manufacturing technology, liquid crystal display technology has been rapidly developing, and liquid crystal displays have been gradually replacing conventional Cathode Ray Tube displays to become the mainstream of future flat panel displays. In the field of liquid crystal display technology, TFT-LCDs (Thin Film Transistor Liquid Crystal Displays) are widely used in the fields of television, computer, mobile phone and the like due to the advantages of large size, high integration, powerful function, flexible process, low cost and the like.

In an ADS mode (Advanced Super Dimension Switch mode) display panel, an electric field generated between edges of slit electrodes in the same planer and an electric field generated between a slit electrode layer and a plate electrode layer form a multi-dimensional electric field, which enables all liquid crystal molecules in all orientations between the slit electrodes and above the electrodes in a liquid crystal cell to rotate so as to enhance work efficiency of the liquid crystals and increase light transmittance. The Advanced Super Dimension Switch technology can improve the display quality of a TFT-LCD product, and is widely applied in the field of liquid crystal display due to the advantages of high resolution, high transmittance, low power consumption, wide viewing angle, high aperture ratio, low color aberration, no push Mura, etc.

The ADS mode display panel is formed by assembling an array substrate (i.e., TFT substrate) and a color filter substrate (i.e., CF substrate) and filling liquid crystals. Generally, gate lines (i.e., scan lines), data lines (i.e., signal lines), TFTs, via holes, pixel electrodes (i.e., display electrodes) and common electrodes are formed on the array substrate. In the array substrate, a plurality of gate lines and a plurality of data lines intersect to define a plurality of pixel units, one of the pixel electrode and the common electrode is a plate-shaped electrode and the other is a slit electrode, and the slit electrode is positioned above the plate-shaped electrode (the present invention is described by taking a case that the pixel electrodes are plate-shaped electrodes and the common electrodes are slit electrodes as an example). A black matrix (BM), RGB and the like are formed on the color filter substrate.

As shown in FIG. 1, the pixel electrode 3 is used for storing charges together with the gate line 2, the data line 1, the TFT and the via hole, and an electric filed is formed between the pixel electrode 3 and the common electrode 4 to drive the liquid crystal molecules between the array substrate and the color filter substrate to rotate, thus displaying different pictures. Specifically, when the gate lines 2 are scanned line by line, the data lines 1 sequentially charge the pixel electrodes 3 in the pixel units of the scanned row, after the scanning is finished, the pixel electrodes 3 in said row maintain the charged charges until said row is scanned again when displaying the next frame. The voltages of the data lines 1 vary continuously in one frame, so as to charge the pixel electrodes 3 in the respective rows.

As shown in FIGS. 1 and 2, to avoid capacitive coupling between a pixel electrode 3 and a data line 1, the pixel electrode 3 and the data line 1 are generally spaced apart from each other at a certain distance, and therefore, electric fields may be generated between the pixel electrode 3 and the data line 1 and between the common electrode 4 and the data line 1. However, since the distance between the pixel electrode 3 and the data line 1 is very small, the generated electric fields have little influence, but the electric field generated between the data line 1 and the slit-shaped common electrode 4 may result in that the liquid crystal molecules above and at both sides of the data line 1 cannot be rotated effectively. To solve this problem, in the prior art, a shielding electrode 5 (in fact, the shielding electrode is a part of the common electrode, but as the shielding electrode is provided above the data line to shield the data line, it is referred to as shielding electrode) is generally formed at a position corresponding to a data line 1 while forming the common electrode 4. The shielding electrode 5 and the common electrode 4 are applied with the same signal so as to shield the data line 1, so that an electric field is prevented from forming between the data line 1 and the common electrode 4, but meanwhile a relatively large capacitance is formed between the shielding electrode 5 and the data line 1. As a result, a data voltage signal on the data line 1 may affect a signal on the shielding electrode 5, which further causes a common electrode signal on the common electrode 4 to be disturbed and fluctuate wildly, resulting in defections of Greenish flicker, relatively large load and the like.

SUMMARY OF THE INVENTION

Technical problems to be solved by the present invention include providing an array substrate, a manufacturing method thereof and a display device, which can effectively alleviate or avoid display defection due to capacitance generated between the data lines and the common electrodes, in view of the above problems existing in the prior art.

To solve the technical problem of the present invention, according to an aspect of the present invention, there is provided an array substrate, comprising: a base substrate, on which a plurality of gate lines and a plurality of data lines are provided; shielding electrodes, which are provided above and electrically insulated from the data lines, and the shielding electrodes at least partially cover the data lines; first electrodes, which are provided in the same layer as the shielding electrodes and are electrically insulated from the shielding electrodes; and second electrodes, which are provided above and electrically insulated from the first electrodes, wherein, the shielding electrodes are applied with a shielding voltage signal, the second electrodes are applied with a stable voltage signal, and no electric field or weak electric filed is formed between the shielding electrodes and the second electrodes.

In the array substrate of the present invention, a data line is at least partially covered by a shielding electrode, and therefore the shielding electrode can at least partially shield the data line, thus a relatively weak electric field or no electric field is generated between the data line and the common electrode, and meanwhile since there is a weak electric field or no electric field between the shielding electrode and the common electrode, the problem that the liquid crystals at both sides of each data line cannot be rotated effectively due to the electric fields generated between the data lines and the common electrodes in the prior art can be effectively alleviated or avoided. Meanwhile, the shielding electrode and the common electrode are supplied with two different signals, of which the electric potentials are equal or close to each other, and therefore, even capacitance is formed between the shielding electrode and the common electrode, the shielding electrode only has a little effect on the common electrode. Moreover, the data line is at least partially covered by the shielding electrode, and although the data line has an effect on the shielding electrode, the data line can reduce or avoid the effect on the common electrode.

In some embodiments, each data line may comprise a plurality of data line bodies and a plurality of connection parts, each connection part is used for connecting two adjacent data line bodies, the array substrate may further comprise a first insulation layer, which is provided above the gate lines, wherein, the data line bodies and the gate lines are provided in the same layer, and the connection parts connect every two adjacent data line bodies in the data lines through via holes penetrating through the first insulation layer.

The shielding electrodes are provided above the data line bodies, and projections of the shielding electrodes on the base substrate completely coincide with those of the data line bodies on the base substrate.

The connection parts and sources and drains of the array substrate are provided in the same layer and employ the same material.

Alternatively, in some other embodiments, the array substrate may further comprise an interlayer insulation layer, the data lines and the gate lines intersect with each other and are separated by the interlayer insulation layer.

Projections of the shielding electrodes on the base substrate completely coincide with those of the data lines on the base substrate.

In the above array substrate, the first electrodes are plate-shaped electrodes and the second electrodes are slit electrodes.

The array substrate may further comprise a second insulation layer, which is provided between the first electrodes and the second electrodes to electrically insulate the first electrodes from the second electrodes, and projections of gaps between second electrodes on the base substrate are covered by the projections of the data lines on the base substrate.

The plate-shaped electrodes may be pixel electrodes, and the slit electrodes may be common electrodes; alternatively, the plate-shaped electrodes may be common electrodes, and the slit electrodes may be pixel electrodes.

To solve the technical problem of the present invention, according to another aspect of the present invention, there is provided a manufacturing method of an array substrate, which comprises steps of: forming a plurality of gate lines and a plurality of data lines on a base substrate; and forming, on the base substrate with the plurality of gate lines and the plurality of data lines formed thereon, shielding electrodes, first electrodes and second electrodes sequentially, wherein, the shielding electrodes are provided above and electrically insulated from the data lines, and the shielding electrodes at least partially cover the data lines; the first electrodes are provided in the same layer as the shielding electrodes and are electrically insulated from the shielding electrodes; the second electrodes are provided above and electrically insulated from the first electrodes, and no electric field or weak electric filed is formed between the shielding electrodes and the second electrodes.

In some embodiments, each data line may comprise a plurality of data line bodies and a plurality of connection parts, each connection part is used for connecting two adjacent data line bodies; the step of forming a plurality of gate lines and a plurality of data lines on a base substrate specifically comprises steps of:

forming the data line bodies of the data lines and the gate lines on the base substrate by one patterning process;

forming a first insulation layer on the base substrate subjected to the above step;

forming, on the base substrate subjected to the above steps, via holes penetrating through the first insulation layer by a patterning process; and forming, on the base substrate subjected to the above steps, connection parts of the data lines through a patterning process, so that adjacent data line bodies in each data line are connected to each other through the via holes by the connection parts.

Sources and drains of the array substrate may be formed while forming the connection parts of the data lines.

Alternatively, in some other embodiments, the step of forming a plurality of gate lines and a plurality of data lines on a base substrate specifically comprises steps of:

forming, on the base substrate, the plurality of gate lines by a patterning process;

forming an interlayer insulation layer on the base substrate with the gate lines formed thereon; and forming, on the base substrate with the interlayer insulation layer formed thereon, the plurality of data lines by a patterning process.

To solve the technical problem of the present invention, according to still another aspect of the present invention, there is provided a display device, which comprises any one of the above array substrates.

DETAILED DESCRIPTION OF THE EMBODIMENTS

In order to enable a person skilled in the art better understand the technical solutions of the present invention, the present invention will be described in detail below in conjunction with the accompanying drawings and specific embodiments.

An array substrate provided by an embodiment of the present invention comprises: a base substrate, on which a plurality of gate lines and a plurality of data lines are provided; shielding electrodes, which are provided above and electrically insulated from the data lines, and the shielding electrodes at least partially cover the data lines; first electrodes, which are provided in the same layer as the shielding electrodes and are electrically insulated from the shielding electrodes; second electrodes, which are provided above and electrically insulated from the first electrodes, wherein, the shielding electrodes are applied with a shielding voltage signal, the second electrodes are applied with a stable voltage signal, and no electric field or weak electric filed is formed between the shielding electrodes and the second electrodes.

The first electrodes may be plate-shaped electrodes, and the second electrodes may be slit electrodes. The plate-shaped electrodes are pixel electrodes, and the slit electrodes are common electrodes; alternatively, the plate-shaped electrodes may be common electrodes, and the slit electrodes may be pixel electrodes. The following embodiments are described by taking a case that the first electrodes are plate-shaped pixel electrodes and the second electrodes are slit-shaped common electrodes as an example. However, the embodiments of the present are not limited to the case that the first electrodes are pixel electrodes and the second electrodes are common electrodes. A case that the first electrodes are common electrodes and the second electrodes are pixel electrodes also falls in the protection scope of the present invention. Also, it should be noted that, in the embodiments of the present invention, "structures in the same layer" means that the structures are formed by one patterning process, but not means that the structures are visually in the same layer.

Figure 1:
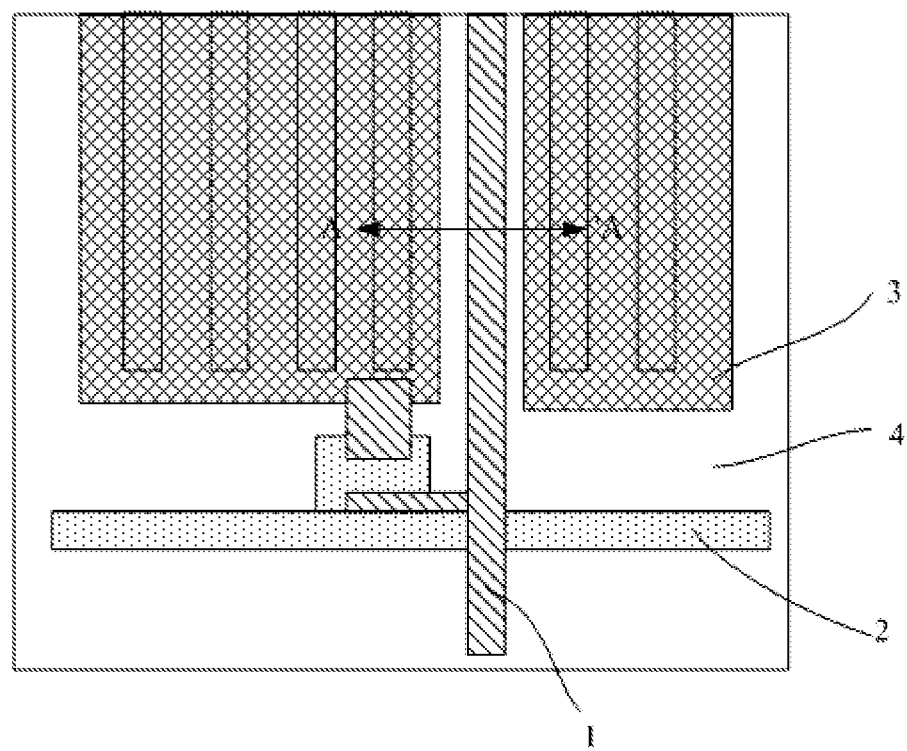
FIG. 1 is a plan view of an array substrate of the prior art.
Figure 2:
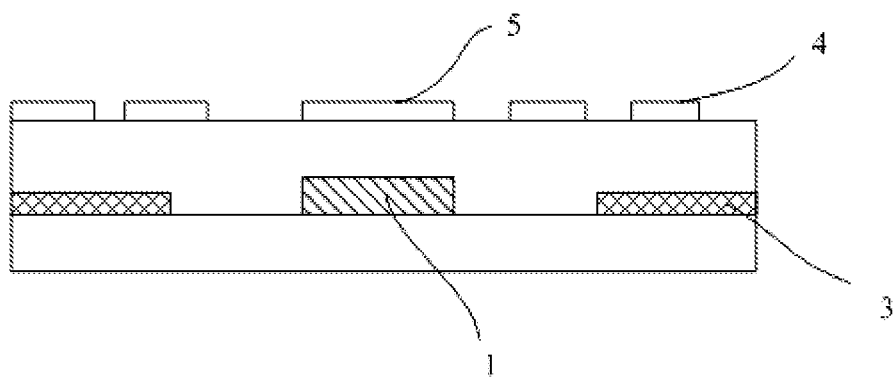
FIG. 2 is a sectional view along Line A-'A of FIG. 1.
Figure 3:
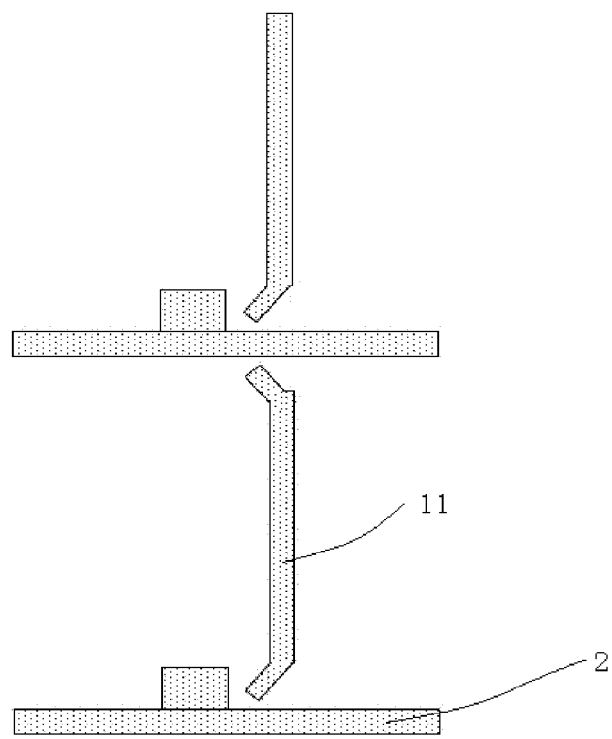
FIG. 3 is a schematic diagram of data lines and gate lines of an array substrate provided by an embodiment of the present invention.
Figure 4:
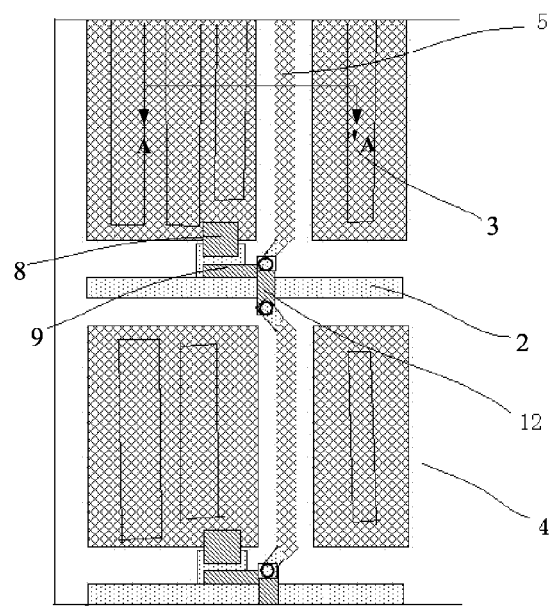
FIG. 4 is a plan view of an array substrate provided by an embodiment of the present invention.
Figure 5:
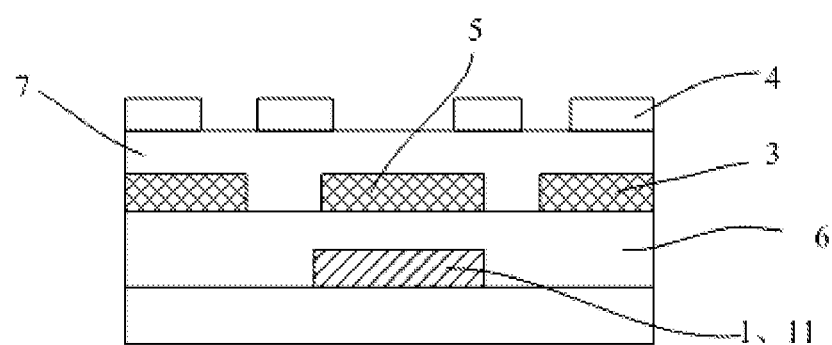
FIG. 5 is a sectional view along Line A-'A of FIG. 4.

Embodiment 1:

As shown in FIGS. 3 to 5, the present embodiment provides an array substrate, which comprises a plurality of data lines 1 and a plurality of gate lines 2, the data lines 1 and the gate lines 2 intersect with each other and are electrically insulated from each other. Each data line 1 comprises data line bodies 11 and connection parts 12 for connecting adjacent data line bodies together; the data line bodies 11 and the gate lines 2 are provided in the same layer, the layer in which the data line bodies 11 and the gate lines 2 are provided is covered by a first insulation layer 6, and connection parts 12 connect every adjacent data line bodies 11 in each data line 1 together through via holes penetrating through the first insulation layer 6 (the connection parts 12 intersect with the gate lines 2). The array substrate of the present embodiment further comprises shielding electrodes 5 provided on the first insulation layer 6, positions of the shielding electrodes 5 correspond to positions of the data line bodies 11, in other words, projections of the shielding electrodes 5 on the base substrate completely coincide with those of the data line bodies 11 on the base substrate, and pixel electrodes 3 (first electrodes) are provided on the first insulation layer 6. Preferably, the shielding electrodes 5, the connection parts 12 and the pixel electrodes 3 may be provided in the same layer and employ the same material (the shielding electrodes 5, the connection parts 12 and the pixel electrodes 3 are electrically insulated from each other). A second insulation layer 7 is provided on the layer in which the pixel electrodes 3 are positioned, and common electrodes 4 (second electrodes) are provided on the second insulation layer 7. The shielding electrodes 5 are applied with a shielding voltage signal, the common electrodes 4 are applied with a stable voltage signal, and no electric field or weak electric filed is generated between the shielding electrodes 5 and the common electrodes 4, that is to say, electric potentials of the shielding electrodes 5 and the common electrodes 4 are equal or close to each other. Since the electric potential of the common electrodes 4 is between 0V and −1V, the shielding electrodes 5 may be grounded.

In the present embodiment, as the shielding electrodes 5 completely cover the data line bodies 11, the shielding electrodes 5 can shield the data line bodies 11, thus no electric filed is generated between the data line bodies 11 and the common electrodes 4. Meanwhile, weak electric field or no electric field is generated between the shielding electrodes 5 and the common electrodes 4, and in this case, the problem that the liquid crystals at both sides of the respective data lines 1 cannot be rotated effectively due to the electric field generated between the data lines 1 and the common electrodes 4 in the prior art can be effectively alleviated or avoided. Meanwhile, the shielding electrodes 5 and the common electrodes 4 are supplied with two different signals, of which the electric potentials are equal or close to each other, and therefore, even capacitances are formed between the shielding electrodes 5 and the common electrodes 4, the shielding electrodes 5 only have a little effect on the common electrodes 4. Moreover, the data lines 1 are shielded by the shielding electrodes 5, and the data lines 1 may have an effect on the shielding electrodes 5, but have no effect on the common electrodes 4.

In the present embodiment, the data line bodies 11 and the gate lines 2 are provided in the same layer and employ the same material, and therefore can be formed by one patterning process; connection parts 12 of the data lines 1, the pixel electrodes 3 and the shielding electrodes 5 are provided in the same layer and employ the same material, and therefore can also be formed by one patterning process, that is to say, the present embodiment can solve the above technical problem in the prior art without adding patterning process.

Preferably, the data lines 1 correspond to the gaps between the common electrodes 4, that is, projections of the gaps between the common electrodes 4 on the base substrate are covered by the projections of the data lines 1 on the base substrate. In this case, capacitance formed between the shielding electrodes 5 and the common electrodes 4 can be further reduced or avoided.

The present embodiment further provides a display device comprising the above array substrate.

The present embodiment further provides a manufacturing method of the above array substrate, and the method specifically comprises the following steps 1 to 6.

At step 1, a pattern comprising gates, gate lines 2 and date line bodies 11 is formed on a base substrate by a patterning process, as shown in FIG. 3.

Specifically, a gate metal film is deposited on the base substrate, then a layer of photoresist is coated on the gate metal film, and the photoresist is exposed by using a mask and then developed. In this process, photoresist remaining regions correspond to regions in which the gates, the gate lines 2 and the data line bodies 11 are to be formed, then the exposed portions of the gate metal film are etched, and finally the photoresist is removed by a photoresist stripping process, so as to form the gates, the gate lines 2 and the data line bodies 11.

At step 2, a first insulation layer 6 is formed on the base substrate subjected to the above step, and via holes for connecting adjacent two data line bodies 11 in each data line 1 are formed by a patterning process.

At step 3, a source-drain metal layer is formed on the base substrate subjected to the above steps, and a pattern comprising sources 8, drains 9 and connection parts 12 of the data lines 1 is formed by one patterning process.

Specifically, the source-drain metal layer is formed on the base substrate subjected to the above steps, a layer of photoresist is coated on the source-drain metal film, the photoresist is exposed by using a mask and then developed, photoresist remaining regions correspond to regions in which the sources 8, the drains 9 and the connection parts 12 of the data lines 1 are to be formed, then the exposed portions of the source-drain metal film are etched, and finally the photoresist is removed, so as to form the sources 8, the drains 9 and the connection parts 12 of the data lines 1. The connection parts 12 of the data lines 1 are connected with the data line bodies 11 through the via holes.

At step 4, a transparent electrode layer is formed on the base substrate subjected to the above steps, and shielding electrodes 5 and pixel electrodes 3 (first electrodes) are formed by one patterning process.

Specifically, the transparent electrode layer is formed on the base substrate subjected to the above steps, then a layer of photoresist is coated on the transparent electrode layer, the photoresist is exposed by using a mask and then developed, photoresist remaining regions correspond to regions in which the pixel electrodes 3 and the shielding electrodes 5 are to be formed, then the exposed portions of the transparent electrode layer are etched, and finally the photoresist is removed, so as to form the pixel electrodes 3 and the shielding electrodes 5.

At step 5, a second insulation layer 7 is formed on the base substrate subjected to the above steps.

At step 6, common electrodes 4 (second electrodes) are formed on the base substrate subjected to the above steps by a patterning process.

Embodiment 2

The present embodiment provides an array substrate, which differs from the array substrate provided in Embodiment 1 mainly in that, a plurality of data lines and a plurality of gate lines of the array substrate provided by the present embodiment are provided in different layers, and are separated by an interlayer insulation layer.

Specifically, the array substrate provided by the present embodiment comprises: a base substrate, a plurality of data lines 1 provided on the base substrate, a interlayer insulation layer provided on a layer in which the data lines 1 are positioned, a plurality of gate lines 2 provided on the interlayer insulation layer and intersecting with the data lines 1, first insulation layer 6 provided on the gate lines 2, shielding electrodes 5 provided on the first insulation layer 6 and corresponding to positions of the data lines 1 (in other words, projections of the shielding electrodes 5 on the base substrate completely coincide with those of the data lines 1 on the base substrate), pixel electrodes 3 (first electrodes) provided in the same as the shielding electrodes 5 and electrically insulated from the shielding electrodes 5, second insulation layer 7 provided on the layer in which the first electrodes are positioned and common electrodes 4 (second electrodes) provided on the second insulation layer 7. In the array substrate, the shielding electrodes 5 are applied with a shielding voltage signal, the common electrodes 4 are applied with a stable voltage signal, and no electric field or weak electric filed is generated between the shielding electrodes 5 and the second electrodes 4, that is to say, electrical potentials of the shielding electrodes 5 and the second electrodes 4 are equal or close to each other. Since the electrical potential of the common electrodes 4 is between 0V and −1V, the shielding electrodes 5 may be grounded.

In the present embodiment, as the shielding electrodes 5 cover the data lines 1, the shielding electrodes 5 can shield the data lines 11, thus no electric filed is generated between the data lines 1 and the common electrodes 4. Meanwhile, weak electric field or no electric field is generated between the shielding electrodes 5 and the common electrodes 4, and in this case, the problem that the liquid crystals at both sides of the respective data lines 1 cannot be rotated effectively due to the electric field generated between the data lines 1 and the common electrodes 4 in the prior art can be effectively alleviated or avoided. Meanwhile, the shielding electrodes 5 and the common electrodes 4 are supplied with two different signals, of which the electric potentials are equal or close to each other, and therefore, even capacitances are formed between the shielding electrodes 5 and the common electrodes 4, the shielding electrodes 5 only have a little effect on the common electrodes 4. Moreover, the data lines 1 are shielded by the shielding electrodes 5, and the data lines 1 may have an effect on the shielding electrodes 5, but have no effect on the common electrodes 4.

Preferably, the data lines 1 correspond to the gaps between the common electrodes 4, that is, projections of the gaps between the common electrodes 4 on the base substrate are covered by the projections of the data lines 1 on the base substrate. In this case, capacitance formed between the shielding electrodes 5 and the common electrodes 4 can be further reduced or avoided.

It should be noted that, although in the above embodiments, the projections of the shielding electrodes 5 on the base substrate completely coincide with those of the data lines 1 (or the data line bodies 11) on the base substrate, the present invention is not limited thereto. As an example, the projection of the shielding electrode 5 on the base substrate may partially coincide with that of the data line 1 (or the data line body 11) on the base substrate, that is, the projection of the shielding electrode 5 at least partially covers the data line 1 (or the data line body 11), and in this case, capacitance between the data line 1 and the common electrode can at least be reduced.

The present embodiment further provides a display device comprising the above array substrate.

The present embodiment further provides a manufacturing method of the above array substrate, and the method differs from the manufacturing method of Embodiment 1 in that, gate lines 2 and data lines 1 of the array substrate are formed in different layers. Accordingly, an interlayer insulation layer may be formed on a base substrate with the gate lines 2 formed thereon, then the data lines 1 may be formed, subsequently a first insulation layer 6, shielding electrodes 5 and pixel electrodes 3, a second insulation layer 7 and common electrodes 4 may be sequentially formed on the base substrate with the data lines 1 formed thereon by using steps similar to those in Embodiment 1. It should be noted that, the shielding electrodes 5 and the pixel electrodes 3 are provided in the same layer and employ the same material, and thus can be formed by one patterning process. The manufacturing method provided by the present embodiment is the same as the existing method for manufacturing an array substrate, except that the shielding electrodes 5 covering the data lines 1 are formed while forming the pixel electrodes 3, and is not described in detail herein.

It can be understood that, above embodiments are merely exemplary embodiments used for explaining the principle of the present invention, but the present invention is not limited thereto. For those skilled in the art, various modifications and improvements may be made without departing from the spirit and essence of the present invention, and these modifications and improvements are deemed as falling within the protection range of the present invention.

The invention claimed is:

1. An array substrate, comprising:
   a base substrate, on which a plurality of gate lines and a plurality of data lines are provided;
   shielding electrodes, which are provided above and electrically insulated from the data lines, the shielding electrodes at least partially covering the data lines;
   first electrodes, which are provided in the same layer as the shielding electrodes and are electrically insulated from the shielding electrodes; and
   second electrodes, which are provided above and electrically insulated from the first electrodes, wherein,
   the shielding electrodes are applied with a shielding voltage signal, the second electrodes are applied with a stable voltage signal, and no electric field or weak electric filed is formed between the shielding electrodes and the second electrodes; and
   each data line comprises a plurality of data line bodies and a plurality of connection parts, each connection part is used for connecting two adjacent data line bodies, the array substrate further comprises a first insulation layer, which is provided above the gate lines, wherein,
   the data line bodies and the gate lines are provided in the same layer, and the connection parts connect every two adjacent data line bodies in the data lines through via holes penetrating through the first insulation layer.

2. The array substrate of claim 1, wherein, the shielding electrodes are provided above the data line bodies, and projections of the shielding electrodes on the base substrate completely coincide with those of the data line bodies on the base substrate.

3. The array substrate of claim 1, wherein, the connection parts and sources and drains of the array substrate are provided in the same layer and employ the same material.

4. The array substrate of claim 1, wherein, the array substrate further comprises an interlayer insulation layer, the data lines and the gate lines intersect with each other and are separated by the interlayer insulation layer.

5. The array substrate of claim 4, wherein, projections of the shielding electrodes on the base substrate completely coincide with those of the data lines on the base substrate.

6. The array substrate of claim 1, wherein, the first electrodes are plate-shaped electrodes and the second electrodes are slit electrodes.

7. The array substrate of claim 6, wherein, the array substrate further comprise a second insulation layer, which is provided between the first electrodes and the second electrodes to electrically insulate the first electrodes from the second electrodes, and projections of gaps between second electrodes on the base substrate are covered by projections of the data lines on the base substrate.

8. The array substrate of claim 7, wherein, the plate-shaped electrodes are pixel electrodes, and the slit electrodes are common electrodes; or
the plate-shaped electrodes are common electrodes, and the slit electrodes are pixel electrodes.

9. A manufacturing method of an array substrate, comprising steps of:
forming a plurality of gate lines and a plurality of data lines on a base substrate; and
sequentially forming, on the base substrate with the plurality of gate lines and the plurality of data lines formed thereon, shielding electrodes, first electrodes and second electrodes, wherein,
the shielding electrodes are provided above and electrically insulated from the data lines, and the shielding electrodes at least partially cover the data lines; the first electrodes are provided in the same layer as the shielding electrodes and are electrically insulated from the shielding electrodes; the second electrodes are provided above and electrically insulated from the first electrodes; and no electric field or weak electric filed is formed between the shielding electrodes and the second electrodes; and
each data line comprises a plurality of data line bodies and a plurality of connection parts, each connection part is used for connecting two adjacent data line bodies, wherein
the step of forming a plurality of gate lines and a plurality of data lines on a base substrate specifically comprises steps of:
forming the data line bodies of the data lines and the gate lines on the base substrate by one patterning process;
forming a first insulation layer on the base substrate subjected to the above step;
forming, on the base substrate subjected to the above steps, via holes penetrating through the first insulation layer by a patterning process; and
forming, on the base substrate subjected to the above steps, connection parts of the data lines through a patterning process, so that adjacent data line bodies in each data line are connected to each other through the via holes by the connection parts.

10. The manufacturing method of an array substrate of claim 9, wherein sources and drains of the array substrate are formed while forming the connection parts of the data lines.

11. The manufacturing method of an array substrate of claim 9, wherein, the step of forming a plurality of gate lines and a plurality of data lines on a base substrate specifically comprises steps of:
forming, on the base substrate, the plurality of gate lines by a patterning process;
forming an interlayer insulation layer on the base substrate with the gate lines formed thereon; and
forming, on the base substrate with the interlayer insulation layer formed thereon, the plurality of data lines by a patterning process.

12. A display device, comprising an array substrate, wherein the array substrate comprises:
a base substrate, on which a plurality of gate lines and a plurality of data lines are provided;
shielding electrodes, which are provided above and electrically insulated from the data lines, the shielding electrodes at least partially covering the data lines;
first electrodes, which are provided in the same layer as the shielding electrodes and are electrically insulated from the shielding electrodes; and
second electrodes, which are provided above and electrically insulated from the first electrodes, wherein,
the shielding electrodes are applied with a shielding voltage signal, the second electrodes are applied with a stable voltage signal, and no electric field or weak electric filed is formed between the shielding electrodes and the second electrodes; and
each data line comprises a plurality of data line bodies and a plurality of connection parts, each connection part is used for connecting two adjacent data line bodies, the array substrate further comprises a first insulation layer, which is provided above the gate lines, wherein,
the data line bodies and the gate lines are provided in the same layer, and the connection parts connect every two adjacent data line bodies in the data lines through via holes penetrating through the first insulation layer.

13. The display device of claim 12, wherein, the shielding electrodes are provided above the data line bodies, and projections of the shielding electrodes on the base substrate completely coincide with those of the data line bodies on the base substrate.

14. The display device of claim 12, wherein, the connection parts and sources and drains of the array substrate are provided in the same layer and employ the same material.

15. The display device of claim 12, wherein, the array substrate further comprises an interlayer insulation layer, the data lines and the gate lines intersect with each other and are separated by the interlayer insulation layer.

16. The display device of claim 15, wherein, projections of the shielding electrodes on the base substrate completely coincide with those of the data lines on the base substrate.

17. The display device of claim 12, wherein, the first electrodes are plate-shaped electrodes, the second electrodes are slit electrodes, and projections of gaps between second electrodes on the base substrate are covered by projections of the data lines on the base substrate.

* * * * *